US009472152B2

(12) United States Patent

Kim et al.

(10) Patent No.: US 9,472,152 B2

(45) Date of Patent: *Oct. 18, 2016

(54) CIRCUIT FOR DRIVING LIQUID CRYSTAL DISPLAY

(71) Applicant: RAONTECH INC., Gyeonggi-do (KR)

(72) Inventors: Min-Seok Kim, Yongin-si (KR); Jang-Sub Sohn, Seoul (KR)

(73) Assignee: RAONTECH INC., Gyeonggi-Do (KR)

( * ) Notice: Subject to any disclaimer, the term of this patent is extended or adjusted under 35 U.S.C. 154(b) by 71 days.

This patent is subject to a terminal disclaimer.

(21) Appl. No.: 14/325,581

(22) Filed: Jul. 8, 2014

(65) Prior Publication Data

US 2015/0325196 A1 Nov. 12, 2015

(30) Foreign Application Priority Data

May 8, 2014 (KR) ........................ 10-2014-0054680

(51) Int. Cl.

*G01R 31/02* (2006.01)

*G09G 3/36* (2006.01)

(52) U.S. Cl.

CPC .......... *G09G 3/3659* (2013.01); *G09G 3/3696* (2013.01); *G09G 2300/043* (2013.01); *G09G 2300/0842* (2013.01); *G09G 2310/0235* (2013.01); *G09G 2310/0291* (2013.01)

(58) Field of Classification Search

CPC .................... G09G 2320/0276; G09G 3/3696

USPC ....................... 324/760.01, 760.02, 548, 713

See application file for complete search history.

(56) References Cited

U.S. PATENT DOCUMENTS

2004/0164943 A1* 8/2004 Ogawa ................. G09G 3/3655 345/92

2006/0244855 A1* 11/2006 Bock ...................... H04N 3/155 348/308

FOREIGN PATENT DOCUMENTS

KR 1020070118457 12/2007

* cited by examiner

*Primary Examiner* — Vincent Q Nguyen

(74) *Attorney, Agent, or Firm* — IPLA P.A.; James E. Bame

(57) ABSTRACT

A circuit for driving a liquid crystal display includes a high selection unit turned on by a high selection signal, a low selection unit turned on by a low selection signal and transferring a low data signal to one side of the first storage capacitor, a high transfer unit connected to one side of the first storage capacitor, turned on by a high transfer signal and transferring voltage, a low transfer unit connected to one side of the first storage capacitor, turned on by a low transfer signal and transferring the voltage stored at one side of the first storage capacitor to one side of the liquid crystal capacitor, and a reset unit connected to one side of the liquid crystal capacitor, turned on by a reset signal and transferring a center voltage to one side of the liquid crystal capacitor.

16 Claims, 1 Drawing Sheet

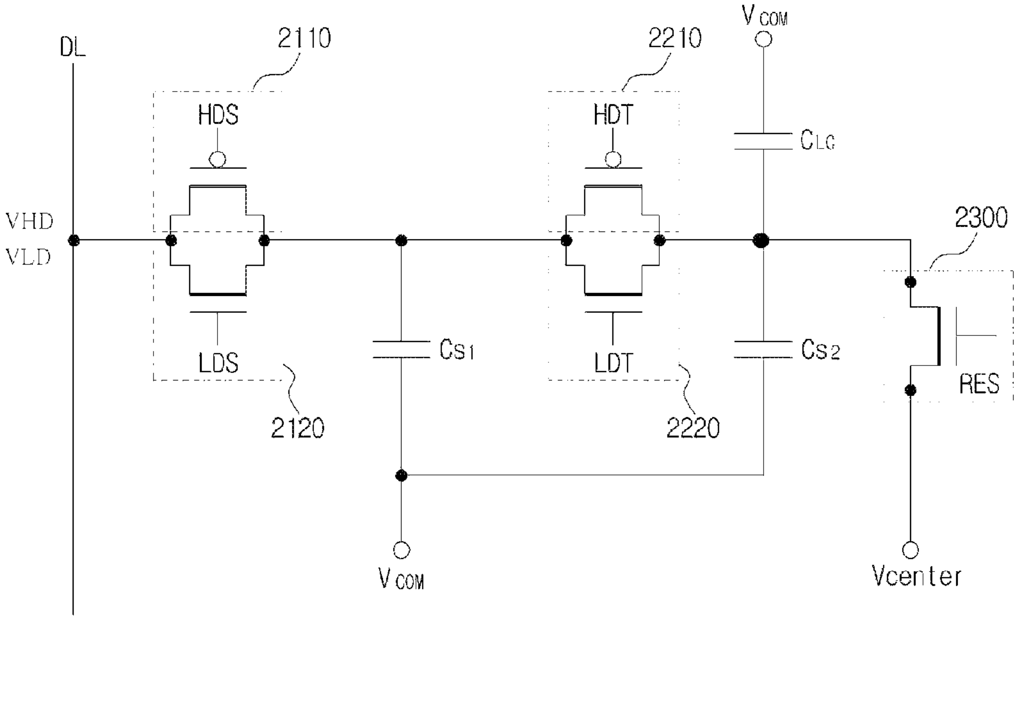
DL
2110
2210
VCOM
HDS
HDT
CLC
VHD
VLD
2300
CS1
CS2
RES
LDS
LDT
2120
2220
VCOM
Vcenter

CIRCUIT FOR DRIVING LIQUID CRYSTAL DISPLAY

BACKGROUND OF THE INVENTION

1. Field of the Invention

The present invention relates to a circuit for driving a liquid crystal display, and more specifically, to a circuit for driving a liquid crystal display, which can effectively suppress degrade of brightness or mixture of colors caused by a difference between the transfer time of a data signal selected first and the transfer time of a data signal selected later.

2. Background of the Related Art

Recently, a field sequential color driving method has been proposed as a method of driving backlight to obtain a further better screen quality using a backlight unit configured of light emitting diodes (LEDs).

In displaying a color, such a field sequential color driving method does not use RGB color filters and displays the color using an afterimage effect generated in the eyes of a person by sequentially driving RGB light sources.

However, a field sequential color liquid crystal display has a problem in that displayed brightness is degraded or colors are mixed due to a difference between the transfer time of a data signal selected first and the transfer time of a data signal selected later.

Korean Laid-Open Patent No. 10-2007-0118457 has been disclosed on Dec. 17, 2007 as a background technique of the present invention.

SUMMARY OF THE INVENTION

Therefore, the present invention has been made in view of the above problem, and it is an object of the present invention to provide a circuit for driving a liquid crystal display, which can effectively suppress degrade of brightness or mixture of colors caused by a difference between the transfer time of a data signal selected first and the transfer time of a data signal selected later.

A circuit for driving a liquid crystal display according to an embodiment of the present invention includes a high selection unit turned on by a high selection signal and transferring a high data signal to one side of a first storage capacitor; a low selection unit turned on by a low selection signal and transferring a low data signal to one side of the first storage capacitor; a high transfer unit connected to one side of the first storage capacitor, turned on by a high transfer signal and transferring voltage stored at one side of the first storage capacitor to one side of a liquid crystal capacitor; a low transfer unit connected to one side of the first storage capacitor, turned on by a low transfer signal and transferring the voltage stored at one side of the first storage capacitor to one side of the liquid crystal capacitor; and a reset unit connected to one side of the liquid crystal capacitor, turned on by a reset signal and transferring a center voltage to one side of the liquid crystal capacitor.

In the circuit for driving a liquid crystal display according to an embodiment of the present invention, the high selection unit and the high transfer unit may be p-MOS transistors, and the low selection unit, the low transfer unit and the reset unit may be n-MOS transistors.

In the circuit for driving a liquid crystal display according to an embodiment of the present invention, while the low selection unit, the high transfer unit, the low transfer unit and the reset unit are turned off and the high selection unit is turned on, the high selection unit may transfer a high data signal to one side of the first storage capacitor.

In the circuit for driving a liquid crystal display according to an embodiment of the present invention, while the low selection unit, the high transfer unit, the low transfer unit and the high selection unit are turned off and the reset unit is turned on thereafter, the reset unit may transfer the center voltage to one side of the liquid crystal capacitor.

In the circuit for driving a liquid crystal display according to an embodiment of the present invention, while the low selection unit, the high selection unit, the low transfer unit and the reset unit are turned off and the high transfer unit is turned on thereafter, the high transfer unit may transfer the voltage stored at one side of the first storage capacitor to one side of the liquid crystal capacitor.

In the circuit for driving a liquid crystal display according to an embodiment of the present invention, while the high selection unit, the high transfer unit, the low transfer unit and the reset unit are turned off and the low selection unit is turned on thereafter, the low selection unit may transfer the low data signal to one side of the first storage capacitor.

In the circuit for driving a liquid crystal display according to an embodiment of the present invention, while the low selection unit, the high transfer unit, the low transfer unit and the high selection unit are turned off and the reset unit is turned on thereafter, the reset unit may transfer the center voltage to one side of the liquid crystal capacitor.

In the circuit for driving a liquid crystal display according to an embodiment of the present invention, while the low selection unit, the high selection unit, the high transfer unit and the reset unit are turned off and the low transfer unit is turned on thereafter, the low transfer unit may transfer the voltage stored at one side of the first storage capacitor to one side of the liquid crystal capacitor.

A circuit for driving a liquid crystal display according to another embodiment of the present invention includes a high selection unit turned on by a high selection signal and transferring a high data signal to one side of a first storage capacitor; a low selection unit turned on by a low selection signal and transferring a low data signal to one side of the first storage capacitor; a high transfer unit connected to one side of the first storage capacitor, turned on by a high transfer signal and transferring voltage stored at one side of the first storage capacitor to one side of a liquid crystal capacitor; a low transfer unit connected to one side of the first storage capacitor, turned on by a low transfer signal and transferring the voltage stored at one side of the first storage capacitor to one side of the liquid crystal capacitor and one side of a second storage capacitor; and a reset unit connected to one side of the liquid crystal capacitor and one side of the second storage capacitor, turned on by a reset signal and transferring a center voltage to one side of the liquid crystal capacitor and one side of the second storage capacitor.

In the circuit for driving a liquid crystal display according to another embodiment of the present invention, the high selection unit and the high transfer unit may be p-MOS transistors, and the low selection unit, the low transfer unit and the reset unit may be n-MOS transistors.

In the circuit for driving a liquid crystal display according to another embodiment of the present invention, while the low selection unit, the high transfer unit, the low transfer unit and the reset unit are turned off and the high selection unit is turned on, the high selection unit may transfer a high data signal to one side of the first storage capacitor.

In the circuit for driving a liquid crystal display according to another embodiment of the present invention, while the low selection unit, the high transfer unit, the low transfer unit and the high selection unit are turned off and the reset unit is turned on thereafter, the reset unit may transfer the center voltage to one side of the liquid crystal capacitor.

In the circuit for driving a liquid crystal display according to another embodiment of the present invention, while the low selection unit, the high selection unit, the low transfer unit and the reset unit are turned off and the high transfer unit is turned on thereafter, the high transfer unit may transfer the voltage stored at one side of the first storage capacitor to one side of the liquid crystal capacitor and one side of the second storage capacitor.

In the circuit for driving a liquid crystal display according to another embodiment of the present invention, while the high selection unit, the high transfer unit, the low transfer unit and the reset unit are turned off and the low selection unit is turned on thereafter, the low selection unit may transfer the low data signal to one side of the first storage capacitor.

In the circuit for driving a liquid crystal display according to another embodiment of the present invention while the low selection unit, the high transfer unit, the low transfer unit and the high selection unit are turned off and the reset unit is turned on thereafter, the reset unit may transfer the center voltage to one side of the liquid crystal capacitor.

In the circuit for driving a liquid crystal display according to another embodiment of the present invention, while the low selection unit, the high selection unit, the high transfer unit and the reset unit are turned off and the low transfer unit is turned on thereafter, the low transfer unit may transfer the voltage stored at one side of the first storage capacitor to one side of the liquid crystal capacitor and one side of the second storage capacitor.

BRIEF DESCRIPTION OF THE DRAWINGS

FIG. 1 is a view showing a circuit for driving a liquid crystal display according to embodiments of the present invention.

DETAILED DESCRIPTION OF THE PREFERRED EMBODIMENT

Details of other embodiments are included in the detailed descriptions and drawings.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. Like reference numerals refer to like elements throughout.

As shown in FIG. 1, a circuit for driving a liquid crystal display according to an embodiment of the present invention is configured to include a high selection unit 2110, a low selection unit 2120, a high transfer unit 2210, a low transfer unit 2220, and a reset unit 2300.

Here, the high selection unit 2110 is turned on by a high selection signal HDS and transfers a high data signal VHD applied to a data line DL to one side of a first storage capacitor CS1, and the low selection unit 2120 is turned on by a low selection signal LDS and transfers a low data signal VLD applied to the data line DL to one side of the first storage capacitor CS1.

In addition, the high transfer unit 2210 is connected to one side of the first storage capacitor CS1, is turned on by a high transfer signal HDT and transfers voltage stored at one side of the first storage capacitor CS1 to one side of a liquid crystal capacitor CLC, and the low transfer unit 2220 is connected to one side of the first storage capacitor CS1, is turned on by a low transfer signal LDT and transfers the voltage stored at one side of the first storage capacitor CS1 to one side of the liquid crystal capacitor CLC and one side of a second storage capacitor CS2.

Meanwhile, the reset unit 2300 is connected to one side of the liquid crystal capacitor CLC and one side of the second storage capacitor CS2 and turned on by a reset signal RES to reset one side of the liquid crystal capacitor CLC to a center voltage Vcenter by transferring the center voltage to one side of the liquid crystal capacitor CLC and one side of the second storage capacitor CS2. Here, a common voltage VCOM is applied to the other side of the liquid crystal capacitor CLC, the other side of the first storage capacitor CS1, and the other side of the second storage capacitor CS2.

Specifically, the high selection unit 2110 and the high transfer unit 2210 may be configured of a p-MOS transistor, and the low selection unit 2120, the low transfer unit 2220 and the reset unit 2300 may be configured of an n-MOS transistor.

Hereinafter, operation of the circuit for driving a liquid crystal display according to an embodiment of the present invention will be described in detail.

First, while the low selection unit 2120, the high transfer unit 2210, the low transfer unit 2220 and the reset unit 2300 are turned off and the high selection unit 2110 is turned on, the high selection unit 2110 transfers a high data signal VHD to one side of the first storage capacitor CS1.

Next, while the low selection unit 2120, the high transfer unit 2210, the low transfer unit 2220 and the high selection unit 2110 are turned off and the reset unit 2300 is turned on, the reset unit 2300 transfers the center voltage Vcenter to one side of the liquid crystal capacitor CLC.

Next, while the low selection unit 2120, the high selection unit 2110, the low transfer unit 2220 and the reset unit 2300 are turned off and the high transfer unit 2210 is turned on, the high transfer unit 2210 transfers the voltage stored at one side of the first storage capacitor CS1 to one side of the liquid crystal capacitor CLC and one side of the second storage capacitor CS2. Here, voltage of the high data signal VHD is stored at one side of the first storage capacitor CS1, and such voltage of the high data signal VHD is distributed to one side of the first storage capacitor CS1, one side of the second storage capacitor CS2 and one side of the liquid crystal capacitor CLC. As a result, the same voltage is maintained at one side of the first storage capacitor CS1, one side of the second storage capacitor CS2 and one side of the liquid crystal capacitor CLC, and magnitude of the voltage is determined by a ratio of capacitance of the first storage capacitor CS1, capacitance of the second storage capacitor CS2 and capacitance of the liquid crystal capacitor CLC.

Next, while the high selection unit 2110, the high transfer unit 2210, the low transfer unit 2220 and the reset unit 2300 are turned off and the low selection unit 2120 is turned on, the low selection unit 2120 transfers a low data signal VLD to one side of the first storage capacitor CS1.

Next, while the low selection unit 2120, the high transfer unit 2210, the low transfer unit 2220 and the high selection unit 2110 are turned off and the reset unit 2300 is turned on, the reset unit 2300 transfers the center voltage Vcenter to one side of the liquid crystal capacitor CLC.

Next, while the low selection unit 2120, the high selection unit 2110, the high transfer unit 2210 and the reset unit 2300 are turned off and the low transfer unit 2220 is turned on, the low transfer unit 2220 transfers the voltage stored at one side of the first storage capacitor CS1 to one side of the liquid crystal capacitor CLC and one side of the second storage capacitor CS2. Here, voltage of the low data signal VLD is stored at one side of the first storage capacitor CS1, and such voltage of the low data signal VLD is distributed to one side of the first storage capacitor CS1, one side of the second storage capacitor CS2 and one side of the liquid crystal capacitor CLC. As a result, the same voltage is maintained at one side of the first storage capacitor CS1, one side of the second storage capacitor CS2 and one side of the liquid crystal capacitor CLC, and magnitude of the voltage is determined by a ratio of capacitance of the first storage capacitor CS1, capacitance of the second storage capacitor CS2 and capacitance of the liquid crystal capacitor CLC.

Meanwhile, the circuit for driving a liquid crystal display according to an embodiment of the present invention sequentially and repeatedly performs the six steps described above.

Accordingly, the circuit for driving a liquid crystal display according to an embodiment of the present invention may effectively suppress degrade of brightness or mixture of colors caused by a difference between the transfer time of a data signal selected first and the transfer time of a data signal selected later by transferring a high data signal VHD or a low data signal VLD to the liquid crystal capacitor CLC through the first storage capacitor CS1 and the second storage capacitor CS2 after initializing the liquid crystal capacitor CLC to the center voltage Vcenter.

The circuit for driving a liquid crystal display according to embodiments of the present invention may effectively suppress degrade of brightness or mixture of colors caused by a difference between the transfer time of a data signal selected first and the transfer time of a data signal selected later by transferring an updated data signal to the liquid crystal capacitor after initializing the data signal stored in the liquid crystal capacitor and updating storage capacitors with a new data signal.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A circuit for driving a liquid crystal display, the circuit comprising:

a high selection unit turned on by a high selection signal and transferring a high data signal received from a data line at an input side of the high selection unit to one side of a first storage capacitor at an output side of the high selection unit;

a low selection unit turned on by a low selection signal that is independent from the high selection signal and transferring a low data signal received from the data line at an output side of the low selection unit to the one side of the first storage capacitor at an output side of the low selection unit;

a high transfer unit connected to the one side of the first storage capacitor and the output side of the high and low selection units at an input side of the high transfer unit, turned on by a high transfer signal and transferring voltage stored at the one side of the first storage capacitor to one side of a liquid crystal capacitor at an output side of the high transfer unit;

a low transfer unit connected to the one side of the first storage capacitor and the output side of the high and low selection units at an input side of the low transfer unit, turned on by a low transfer signal that is independent from the high transfer signal and transferring the voltage stored at the one side of the first storage capacitor to the one side of the liquid crystal capacitor at an output side of the low transfer unit; and a reset unit connected to the one side of the liquid crystal capacitor, turned on by a reset signal and transferring a center voltage at an input side of the reset unit to the one side of the liquid crystal capacitor at an output side of the reset unit, wherein the high selection unit and the low selection unit share the input side and the output side for receiving and transferring the high or low data signal, respectively, wherein the high transfer unit and the low transfer unit share the input side and the output side for transferring the voltage stored at the one side of the first storage capacitor from the shared input side to the shared output side, and wherein each of other side of the first storage capacitor and other side of the liquid crystal capacitor is connected to a common voltage.

2. The circuit according to claim 1, wherein the high selection unit and the high transfer unit are p-MOS transistors, and the low selection unit, the low transfer unit and the reset unit are n-MOS transistors.

3. The circuit according to claim 1, wherein while the low selection unit, the high transfer unit, the low transfer unit and the reset unit are turned off and the high selection unit is turned on, the high selection unit transfers a high data signal to one side of the first storage capacitor.

4. The circuit according to claim 3, wherein while the low selection unit, the high transfer unit, the low transfer unit and the high selection unit are turned off and the reset unit is turned on thereafter, the reset unit transfers the center voltage to one side of the liquid crystal capacitor.

5. The circuit according to claim 4, wherein while the low selection unit, the high selection unit, the low transfer unit and the reset unit are turned off and the high transfer unit is turned on thereafter, the high transfer unit transfers the voltage stored at one side of the first storage capacitor to one side of the liquid crystal capacitor.

6. The circuit according to claim 5, wherein while the high selection unit, the high transfer unit, the low transfer unit and the reset unit are turned off and the low selection unit is turned on thereafter, the low selection unit transfers the low data signal to one side of the first storage capacitor.

7. The circuit according to claim 6, wherein while the low selection unit, the high transfer unit, the low transfer unit and the high selection unit are turned off and the reset unit is turned on thereafter, the reset unit transfers the center voltage to one side of the liquid crystal capacitor.

8. The circuit according to claim 7, wherein while the low selection unit, the high selection unit, the high transfer unit and the reset unit are turned off and the low transfer unit is turned on thereafter, the low transfer unit transfers the voltage stored at one side of the first storage capacitor to one side of the liquid crystal capacitor.

9. A circuit for driving a liquid crystal display, the circuit comprising:

a high selection unit turned on by a high selection signal and transferring a high data signal received from a data line at an input side of the high selection unit to one side of a first storage capacitor at an output side of the high selection unit;

a low selection unit turned on by a low selection signal that is independent from the high selection signal and transferring a low data signal received from the data line at an output side of the low selection unit to the one side of the first storage capacitor at an output side of the low selection unit;

a high transfer unit connected to the one side of the first storage capacitor and the output side of the high and low selection units at an input side of the high transfer unit, turned on by a high transfer signal and transferring voltage stored at the one side of the first storage capacitor to one side of a liquid crystal capacitor at an output side of the high transfer unit;

a low transfer unit connected to the one side of the first storage capacitor and the output side of the high and low selection units at an input side of the low transfer unit, turned on by a low transfer signal that is independent from the high transfer signal and transferring the voltage stored at the one side of the first storage capacitor to the one side of the liquid crystal capacitor and one side of a second storage capacitor at an output side of the low transfer unit; and a reset unit connected to the one side of the liquid crystal capacitor, turned on by a reset signal and transferring a center voltage at an input side of the reset unit to the one side of the liquid crystal capacitor and the one side of the second storage capacitor at an output side of the reset unit, wherein the high selection unit and the low selection unit share the input side and the output side for receiving and transferring the high or low data signal, respectively, wherein the high transfer unit and the low transfer unit share the input side and the output side for transferring the voltage stored at the one side of the first storage capacitor from the shared input side to the shared output side, and wherein each of other side of the first storage capacitor, other side of the liquid crystal capacitor, and other side of the second storage capacitor is connected to a common voltage.

10. The circuit according to claim 9, wherein the high selection unit and the high transfer unit are p-MOS transistors, and the low selection unit, the low transfer unit and the reset unit are n-MOS transistors.

11. The circuit according to claim 9, wherein while the low selection unit, the high transfer unit, the low transfer unit and the reset unit are turned off and the high selection unit is turned on, the high selection unit transfers a high data signal to one side of the first storage capacitor.

12. The circuit according to claim 11, wherein while the low selection unit, the high transfer unit, the low transfer unit and the high selection unit are turned off and the reset unit is turned on thereafter, the reset unit transfers the center voltage to one side of the liquid crystal capacitor.

13. The circuit according to claim 12, wherein while the low selection unit, the high selection unit, the low transfer unit and the reset unit are turned off and the high transfer unit is turned on thereafter, the high transfer unit transfers the voltage stored at one side of the first storage capacitor to one side of the liquid crystal capacitor and one side of the second storage capacitor.

14. The circuit according to claim 13, wherein while the high selection unit, the high transfer unit, the low transfer unit and the reset unit are turned off and the low selection unit is turned on thereafter, the low selection unit transfers the low data signal to one side of the first storage capacitor.

15. The circuit according to claim 14, wherein while the low selection unit, the high transfer unit, the low transfer unit and the high selection unit are turned off and the reset unit is turned on thereafter, the reset unit transfers the center voltage to one side of the liquid crystal capacitor.

16. The circuit according to claim 15, wherein while the low selection unit, the high selection unit, the high transfer unit and the reset unit are turned off and the low transfer unit is turned on thereafter, the low transfer unit transfers the voltage stored at one side of the first storage capacitor to one side of the liquid crystal capacitor and one side of the second storage capacitor.

* * * * *